(12) United States Patent
Karnezos

(10) Patent No.: US 7,306,973 B2
(45) Date of Patent: Dec. 11, 2007

(54) METHOD FOR MAKING A SEMICONDUCTOR MULTIPACKAGE MODULE INCLUDING A PROCESSOR AND MEMORY PACKAGE ASSEMBLIES

(75) Inventor: Marcos Karnezos, Palo Alto, CA (US)

(73) Assignee: Chippac, Inc., Fremont, CA (US)

( * ) Notice: Subject to any disclaimer, the term of this patent is extended or adjusted under 35 U.S.C. 154(b) by 0 days.

(21) Appl. No.: 11/355,920

(22) Filed: Feb. 16, 2006

(65) Prior Publication Data

US 2006/0151867 A1    Jul. 13, 2006

Related U.S. Application Data

(62) Division of application No. 10/618,933, filed on Jul. 14, 2003, now Pat. No. 7,034,387.

(60) Provisional application No. 60/460,541, filed on Apr. 4, 2003.

(51) Int. Cl.
*H01L 21/00* (2006.01)
*H01L 23/02* (2006.01)

(52) U.S. Cl. .............. 438/109; 438/125; 257/686; 257/724; 257/784

(58) Field of Classification Search ............ None
See application file for complete search history.

(56) References Cited

U.S. PATENT DOCUMENTS

| | | | |
|---|---|---|---|
| 4,982,265 A | 1/1991 | Watanabe et al. | |
| 5,138,438 A | 8/1992 | Masayuki et al. | |
| 5,226,582 A | 7/1993 | Kubota et al. | |
| 5,397,747 A | 3/1995 | Angiulli et al. | |
| 5,842,628 A | 12/1998 | Nomoto et al. | |
| 5,874,780 A | 2/1999 | Murakami | |
| 6,150,724 A * | 11/2000 | Wenzel et al. | 257/777 |
| 6,392,896 B1 * | 5/2002 | Stoller | 361/760 |
| 6,495,912 B1 | 12/2002 | Huang et al. | |
| 6,552,423 B2 | 4/2003 | Song et al. | |
| 6,596,561 B2 * | 7/2003 | Takahashi et al. | 438/113 |
| 6,633,078 B2 | 10/2003 | Hamaguchi et al. | |
| 6,727,581 B2 | 4/2004 | Abe et al. | |
| 6,760,224 B2 | 7/2004 | Moden et al. | |
| 6,778,390 B2 | 8/2004 | Michael | |
| 6,829,147 B2 | 12/2004 | Streltsov | |
| 6,900,528 B2 * | 5/2005 | Mess et al. | 257/686 |
| 7,034,387 B2 * | 4/2006 | Karnezos | 257/686 |
| 2002/0079567 A1 | 6/2002 | Lo et al. | |
| 2004/0104469 A1 | 6/2004 | Yagi et al. | |

OTHER PUBLICATIONS

Balatsos, A., A Bridge for A Multiprocessor Graphics System, IEEE, 2002, pp. 646-650.

* cited by examiner

*Primary Examiner*—Alonzo Chambliss

(57) ABSTRACT

A semiconductor multi-package module includes a processor and a plurality of memory packages mounted on a surface of the multipackage module substrate. In some embodiments the memory packages include stacked die packages, and in some embodiments the memory packages include stacked memory packages. In some embodiments the processor is situated at or near the center of the multipackage module substrate and the plurality of memory packages or of stacked memory package assemblies are situated on the multipackage module substrate adjacent the processor.

13 Claims, 6 Drawing Sheets

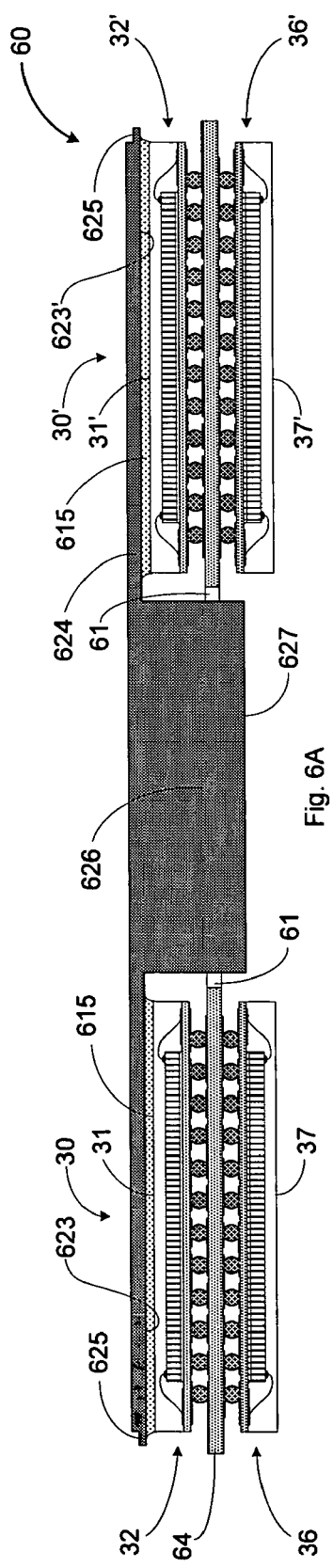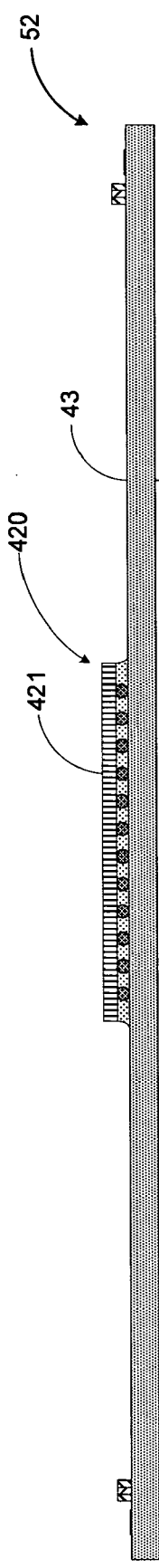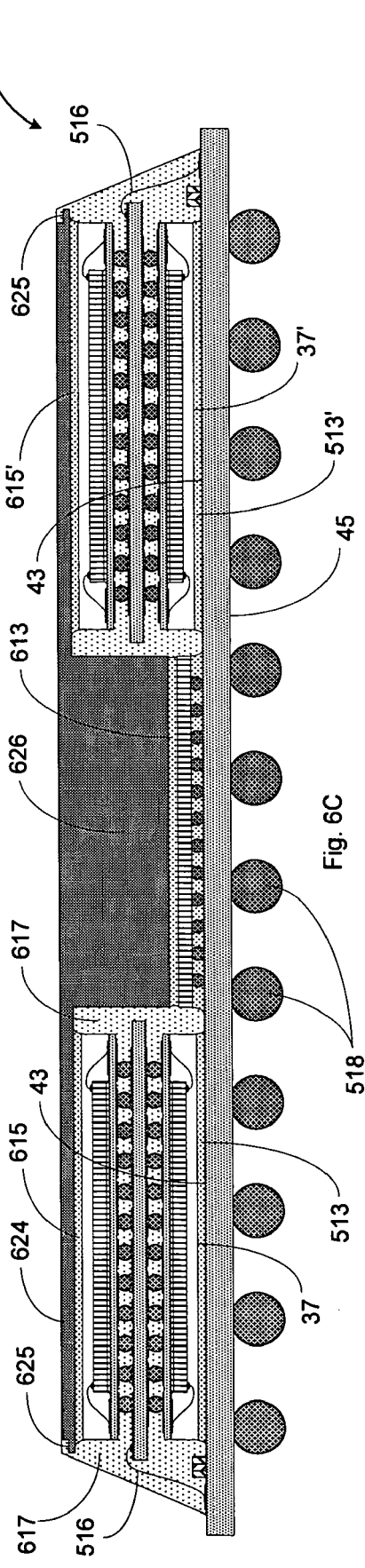

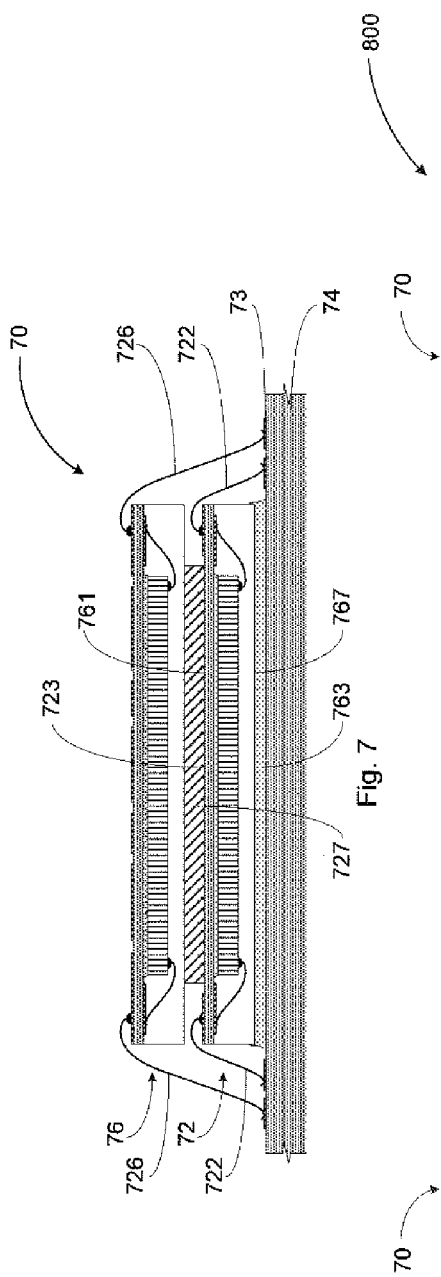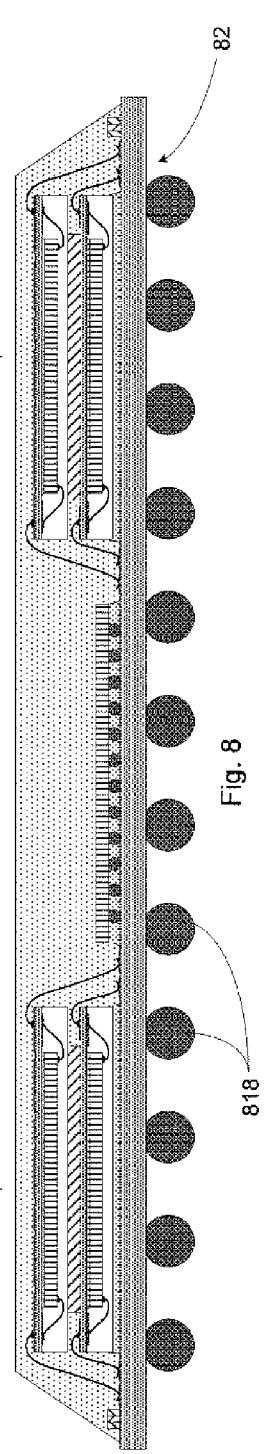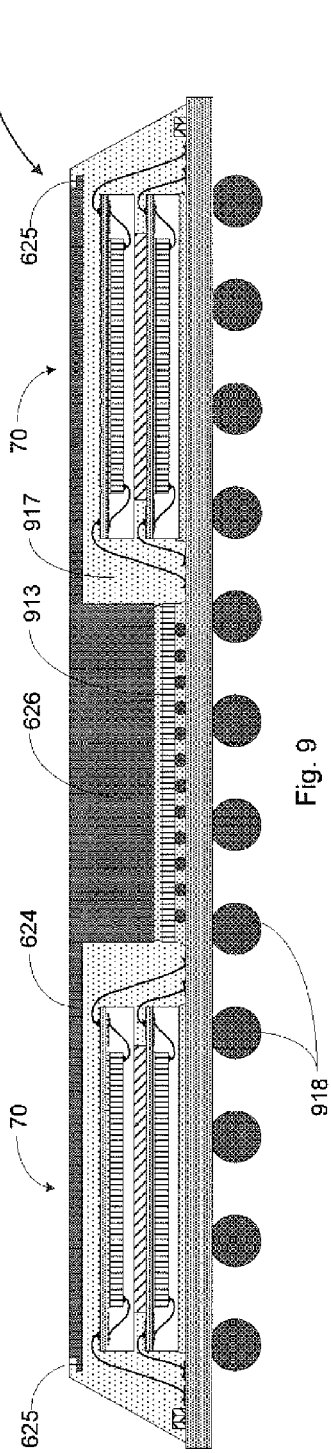

METHOD FOR MAKING A SEMICONDUCTOR MULTIPACKAGE MODULE INCLUDING A PROCESSOR AND MEMORY PACKAGE ASSEMBLIES

CROSS-REFERENCE TO RELATED APPLICATION

This application is a division of U.S. application Ser. No. 10/618,933, titled "Semiconductor multipackage module including processor and memory package assemblies", which was filed on 14 Jul. 2003 now U.S. Pat No. 7,034,387 and which claims the benefit of U.S. Provisional Application No. 60/460,541, filed 4 Apr. 2003, each of which is hereby incorporated by reference in its entirety.

BACKGROUND

This invention relates to semiconductor packaging. In particular this invention relates to semiconductor packages that include processor and memory chips in the package.

It is desirable in some applications to include semiconductor memory chips in the same package as a processor, such as a CPU or ASIC or GPU.

It is also desirable generally in the computing industry to increase performance while minimizing the sizes of computing devices and also lowering costs and increasing manufacturing yields.

SUMMARY

This invention is directed to multi-package modules that include a processor and a plurality of memory packages mounted on a surface of the multipackage module substrate.

According to the invention, a processor, such as an ASIC or a CPU or a GPU, is mounted on a surface of a module substrate, and two or more memory packages are mounted on the upper surface of the substrate.

Generally, the invention features various configurations of multipackage modules. According to the invention the memory packages may include stacked die packages; or the memory packages may include stacked memory packages. Also according to the invention the processor may be mounted on the lower surface of the module substrate, or the processor may be mounted on the upper surface of the module substrate. In embodiments in which the processor is mounted on the upper surface of the module substrate, it may be situated on a portion of the substrate surface at or near the center of the substrate, and the plurality of memory packages or of stacked memory package assemblies may be situated on parts of the module substrate surface adjacent the processor. Or, in embodiments in which the processor is mounted on the upper surface of the module substrate, the plurality of memory packages or of stacked memory package assemblies may be stacked over the processor.

Also according to the invention the z-interconnection between the memory packages and the module substrate is formed by wire bonding. Where the memory packages are configured as stacked memory package assemblies the overlying memory packages in each stack may be connected to a common stacked memory package assembly substrate, and in such embodiments the z-interconnection between the memory packages and the module substrate is formed by wire bonding the common stacked memory package assembly substrate to the module substrate. Also, where the memory packages are configured as stacked memory package assemblies the memory packages may be of a ball grid array (BGA) type or of a land grid array (LGA) type.

In one general aspect the invention features a multipackage module including a processor, such as a CPU, GPU or ASIC, mounted on a part of the lower surface of a module substrate, and a plurality of memory packages each mounted on a portion of the upper surface of the module substrate. The z-interconnect between the memory packages and the module substrate is made by wire bonding between the package substrates and the module substrate. Preferably according to this aspect of the invention the memory packages are inverted LGA type packages; that is, the side of the memory package substrate on which the memory die is affixed faces downward toward the upper surface of the module substrate.

In another general aspect the invention features a multipackage module including a processor, such as a CPU, GPU or ASIC, mounted on a part of the upper surface of a module substrate, and a plurality of memory packages in a memory package assembly are mounted over the processor. The memory packages in the memory package assembly are mounted on a common memory assembly substrate, and the z-interconnect between the memory packages and the module substrate is made by wire bonding between the common memory assembly substrate and the module substrate. The memory packages may be configured as memory package stacks, including for example two memory packages in each stack.

The memory packages may be BGA type packages, the array of balls providing for connection of each BGA memory package to a surface of the common memory-assembly substrate. In embodiments in which the memory packages are BGA packages configured as memory package stacks, an upper package in the stack is connected by way of its array of balls to the upper surface of the common memory assembly substrate and a lower package in the stack is inverted and connected by way of its array of balls to the lower surface of the common memory assembly substrate.

Or, the memory packages may be LGA type packages. The LGA type memory packages may be configured as memory package stacks, including for example two memory packages in each stack. The z-interconnection between the LGA memory packages and the module substrate may be made by wire bonding between each LGA memory package substrate and the module substrate. In some configurations the LGA memory packages in each stack may be stacked in like orientation, and they may be separated by spacers to provide relief for z-interconnect wire bond loops. In other configurations each LGA memory package in each stack may be wire bonded to a common memory assembly substrate, and the z-interconnect between the memory packages and the module substrate is made by wire bonding between the common memory assembly substrate and the module substrate. In some such embodiments a lower package in each stack is affixed to, and is wire bond connected to, a lower surface of the common memory assembly substrate; and an upper package in each stack is inverted and affixed to, and is wire bond connected to, an upper surface of the common memory assembly substrate.

In another general aspect the invention features a multipackage module including a processor, such as a CPU, GPU or ASIC, mounted on a portion of the upper surface of a module substrate, and a plurality of memory packages in a memory package assembly are mounted onto or over portions of the module substrate adjacent the portion to which the processor is mounted. In some embodiments the processor is mounted onto a portion of the module substrate surface at or near the center, and the memory packages are mounted onto or are situated over portions of the surface to one side of the processor mounting portion or, more usually, to opposite sides of the processor mounting portion of the module substrate surface. In some embodiments the memory modules are mounted onto or are situated over portions of the module substrate surface adjacent the processor mounting portion.

According to this aspect of the invention, the memory packages may be arranged in a memory package assembly. In some such embodiments the packages are mounted on a common memory assembly substrate, and the z-interconnect between the memory packages and the module substrate is made by wire bonding between the common memory assembly substrate and the module substrate. The memory packages may be configured as memory package stacks, including for example two memory packages in each stack.

Also according to this aspect of the invention, where the memory packages are arranged in a memory package assembly and the memory packages are mounted onto or over portions of the substrate surface on opposite sides of the processor mounting portion, the common memory assembly substrate may span the area over the processor, or may be provided with an opening over the processor. Where an opening is provided in the common memory assembly substrate over the processor, a heat slug may occupy the volume between the top of the processor and the top of the module. At the top of the module the heat slug may contact a broader heat spreader; or, the heat slug may be configured at the top of the module as a broader heat spreader.

Also according to this aspect of the invention the memory packages may be BGA type packages, the array of balls providing for connection of each BGA memory package to a surface of the common memory assembly substrate. In embodiments in which the memory packages are BGA packages configured as memory package stacks, an upper package in the stack is connected by way of its array of balls to the upper surface of the common memory assembly substrate and a lower package in the stack is inverted and connected by way of its array of balls to the lower surface of the common memory assembly substrate.

Also according to this aspect of the invention, the memory packages may be LGA type packages. The LGA type memory packages may be configured as memory package stacks, including for example two memory packages in each stack. The z-interconnection between the LGA memory packages and the module substrate may be made by wire bonding between each LGA memory package substrate and the module substrate. In some configurations the LGA memory packages in each stack may be stacked in like orientation, and they may be separated by spacers to provide relief for z-interconnect wire bond loops. In other configurations each LGA memory package in each stack may be wire bonded to a common memory assembly substrate, and the z-interconnect between the memory packages and the module substrate is made by wire bonding between the common memory assembly substrate and the module substrate. In some such embodiments a lower package in each stack is affixed to, and is wire bond connected to, a lower surface of the common memory assembly substrate; and an upper package in each stack is inverted and affixed to, and is wire bond connected to, an upper surface of the common memory assembly substrate.

In another general aspect the invention features a multi-package module including a processor, such as a CPU, GPU or ASIC, mounted on a portion of the upper surface of a module substrate, and a plurality of memory packages configured in a plurality of memory package stacks mounted onto portions of the module substrate adjacent the portion to which the processor is mounted. In some embodiments the processor is mounted onto a portion of the module substrate surface at or near the center, and the memory package stacks are mounted onto portions of the surface to one side of the processor mounting portion or, more usually, to opposite sides of the processor mounting portion of the module substrate surface. In some embodiments the memory stacks are mounted onto portions of the module substrate surface adjacent the processor mounting portion.

According to this aspect of the invention, the memory packages in each stack may be arranged in a memory package stack assembly, including for example two memory packages in each stack. In some such embodiments the packages are mounted on a common memory stack substrate, and the z-interconnect between the memory packages and the module substrate is made by wire bonding between the common memory stack substrate and the module substrate.

Also according to this aspect of the invention, a heat slug may occupy the volume between the top of the processor and the top of the module. At the top of the module the heat slug may contact a broader heat spreader; or, the heat slug may be configured at the top of the module as a broader heat spreader.

Also according to this aspect of the invention the memory packages may be BGA type packages, the array of balls providing for connection of each BGA memory package to a surface of the common memory stack substrate. In embodiments in which the memory packages are BGA packages configured as memory package stacks, an upper package in the stack is connected by way of its array of balls to the upper surface of the common memory stack substrate and a lower package in the stack is inverted and connected by way of its array of balls to the lower surface of the common memory stack substrate.

Also according to this aspect of the invention, the memory packages may be LGA type packages. The LGA type memory packages may be configured as memory package stacks, including for example two memory packages in each stack. The z-interconnection between the LGA memory packages and the module substrate may be made by wire bonding between each LGA memory package substrate and the module substrate. In some configurations the LGA memory packages in each stack may be stacked in like orientation, and they may be separated by spacers to provide relief for z-interconnect wire bond loops. In other configurations each LGA memory package in each stack may be wire bonded to a common memory assembly substrate, and the z-interconnect between the memory packages and the module substrate is made by wire bonding between the common memory assembly substrate and the module substrate. In some such embodiments a lower package in each stack is affixed to, and is wire bond connected to, a lower surface of the common memory assembly substrate; and an upper package in each stack is inverted and affixed to, and is wire bond connected to, an upper surface of the common memory assembly substrate.

In another general aspect the invention features a multi-package module including a processor, such as a CPU, GPU or ASIC, mounted on a portion of the upper surface of a module substrate, and a plurality of stacked die memory packages mounted onto portions of the module substrate adjacent the portion to which the processor is mounted. In some embodiments the processor is mounted onto a portion of the module substrate surface at or near the center, and the stacked die memory packages are mounted onto portions of the surface to one side of the processor mounting portion or, more usually, to opposite sides of the processor mounting portion of the module substrate surface. In some embodiments the memory modules are mounted onto portions of the module substrate surface adjacent the processor mounting portion.

According to this aspect of the invention, the stacked die in each memory package are wire bonded to the memory package substrate, and the z-interconnect between the memory packages and the module substrate is made by wire bonding between the memory package substrates and the module substrate.

Also according to this aspect of the invention, a heat slug may occupy the volume between the top of the processor and the top of the module. At the top of the module the heat slug may contact a broader heat spreader; or, the heat slug may be configured at the top of the module as a broader heat spreader.

Preferably according to this aspect of the invention the memory packages may be LGA type packages. The z-interconnection between the LGA memory packages and the module substrate may be made by wire bonding between each LGA memory package substrate and the module substrate.

In another general aspect the invention features a method for making a multi-package module including a processor and a plurality of memory packages, by providing a module substrate, providing the processor, and providing the memory packages; mounting the processor on a surface of the substrate; mounting the memory packages over or onto a surface of the substrate; and forming wire bonds to make z-interconnection of the memory packages and the module substrate.

In some embodiments of the method the processor is mounted on a lower surface of the module substrate, that is, on the surface on which the solder balls are to be attached, for connection of the module to, for example, a motherboard; and in such embodiments the processor attachment portion of the substrate is in an area of the lower substrate surface not including solder ball pads. In other embodiments the processor is mounted on an upper surface of the module substrate, that is, on the surface opposite the surface on which the solder balls are to be attached, for connection of the module to, for example, a motherboard.

In some embodiments the memory packages are provided as a memory package assembly or as a memory package stack, and the z-interconnection is made by forming wire bonds between a common memory assembly substrate or a common memory stack substrate and the module substrate.

In methods according to the invention for making multi-package modules any of the various packages, or package stacks, or package assemblies, may be readily tested at various stages in the assembly process, so that components that are when tested not within specification can be discarded before they are combined with additional components. Particular advantages of the method of the invention include the use of established manufacturing infrastructure, the use of standard memory and processor components, low production cost, and design flexibility. The resulting multi-package modules are within accepted footprint and thickness dimensions.

Additional process steps will be employed to complete the multipackage modules according to the invention, as will be appreciated in view of the description herein.

The multipackage modules according to the invention can be used for building computers, telecommunications equipment, and consumer and industrial electronics devices.

BRIEF DESCRIPTION OF THE DRAWINGS

FIG. 6A is a diagrammatic sketch in a sectional view thru a stacked memory package assembly according to another aspect of the invention, suitable for use together with a multipackage module substrate as shown for example in FIG. 6B in an embodiment of the invention as shown in FIG. 6C.

FIG. 6B is a diagrammatic sketch in a sectional view thru a multipackage module substrate including a medially-mounted processor unit suitable for use in a multipackage module according to an aspect of the invention.

FIG. 6C is a diagrammatic sketch in a sectional view thru a multipackage module according to an aspect of the invention.

FIG. 7 is a diagrammatic sketch in a sectional view thru a memory package stack in an arrangement suitable for use in embodiments of the invention as shown for example in FIG. 8 or FIG. 9.

FIG. 8 is a diagrammatic sketch in a sectional view thru a multipackage module according to another aspect of the invention.

FIG. 9 is a diagrammatic sketch in a sectional view thru a multipackage module according to a further aspect of the invention.

DETAILED DESCRIPTION

Figure 1:
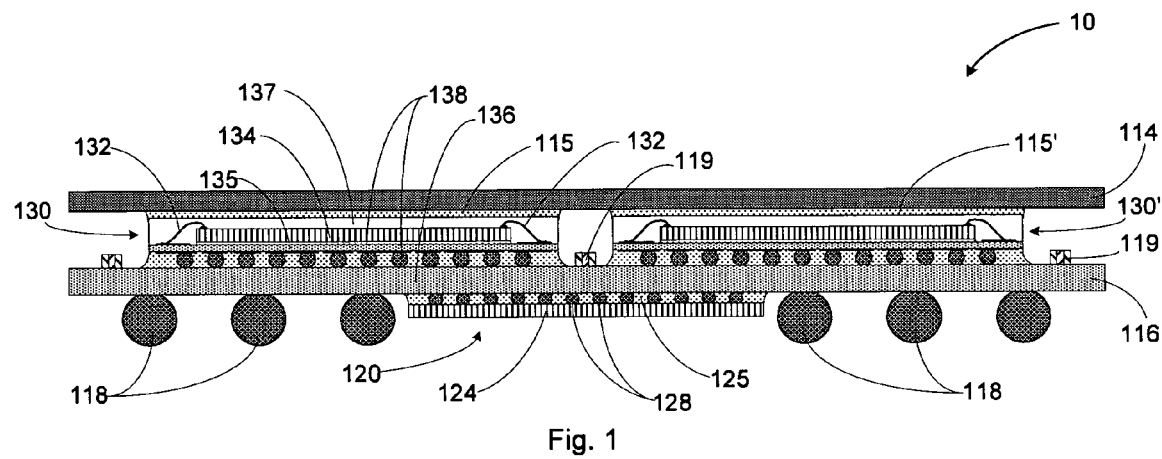
FIG. 1 is a diagrammatic sketch in a sectional view thru a conventional multipackage module having a processor unit affixed to the lower side, and memory packages affixed to the upper side, of the multipackage module substrate.

The invention will now be described in further detail by reference to the drawings, which illustrate various embodiments of the invention. The drawings are diagrammatic, showing features of the invention and their relation to other features and structures, and are not made to scale. For improved clarity of presentation, the FIGS. do not include some details of engineering and design, which are not necessary to an understanding of the invention, but will be clearly understood in view of the state of the art. Also for improved clarity of presentation, in the FIGS. illustrating embodiments of the invention, elements corresponding to elements shown in other drawings are not all particularly renumbered, although they are all readily identifiable in all the FIGS. Terms indicating relative orientation, such as "upper", "lower", "top", "bottom", "right", "left" and the like are employed for convenient reference to directions shown in the drawings and, as will be appreciated, any of the embodiments may be deployed in other orientations (upside down, for instance) than as shown in the FIGS.

Turning now to FIG. 1, there is shown generally at 10 a sectional view thru a conventional multipackage module having a processor unit affixed to the lower side, and memory packages affixed to the upper side, of the multipackage module substrate. The module has the processor flip chip mounted in a "die-up" configuration. A module substrate 116, also 136, is a laminate including patterned electrically conductive trace layers over the "upper" and "lower" surfaces of a dielectric layer. Selected upper and lower traces are connected by way of vias through the dielectric layer. Solder balls 118 are attached to second-level interconnect sites on selected traces in the lower surface of the module substrate, for connection by solder reflow to, for example, a motherboard (not shown).

A processor 120 is mounted onto a processor mounting portion of the lower surface of the module substrate 116. As shown in this example, the processor 120 has a flip-chip configuration; it includes a die 124 electrically connected by way of balls or bumps 128 to interconnect sites (not shown) on selected traces in the lower surface of the module substrate, and affixed to the surface using an adhesive underfill material 125. A plurality of memory packages 130, 130' (there may typically be four memory packages; two are shown in the view of FIG. 1) are mounted on the upper surface of the module substrate 136. In the embodiment illustrated in FIG. 1 the memory packages are saw-singulated ball grid array (BGA) packages. Referring particularly to BGA package 130, each BGA package includes a die 134 affixed using an adhesive to a memory package substrate 135. The package substrate is a multi-metal layer laminate (having at least two metal layers, and typically having more than 2 metal layers), having patterned electrically conductive traces on the upper and lower surfaces of a dielectric layer; selected upper and lower traces are connected by way of vias through the dielectric layer. The upward-facing active surface of the die is electrically connected to traces on the die attach (upper) surface of the package substrate 135 by wire bonds 132. The active surface of the die and the wire bonds are protected by an encapsulant 137. Solder balls 138 attached to solder ball pads on the ball attach (lower) surface of the package substrate 135 provide for electrical connection by solder reflow to solder ball pads (not shown) in the upper surface of the module substrate 136, and the BGA is affixed using an adhesive underfill material. Additionally, passive devices, e.g., 119, are affixed to and electrically connected to traces in, the upper surface of the module substrate 116. Also, in the illustrative example shown in FIG. 1, a heat spreader 114 is affixed to the upper surfaces of the BGA packages 130, 130' using an adhesive 115, 115'. A module such as is illustrated by way of example in FIG. 1, where the processor is a GPU, may typically have a module footprint about 31 mm×31 mm and an overall profile thickness about 3.2 mm or greater, with a 10.5 mm×10.5 mm GPU and 12 mm×12 mm memory BGA packages.

A configuration as shown in FIG. 1 may provide certain benefits and advantages, as well as compromises and disadvantages. Particularly, for example, situation of the flip chip processor on the underside of the module substrate provides a high electrical performance, as no vias are required for connection of the processor chip to the solder balls; that is, the chip-to-ball connections can be point-to-point, avoiding electrical parasitics. Also, situation of the flip chip processor on the underside of the module substrate can provide a thin module, because the processor occupies space between the balls and the motherboard, and adds no overhead thickness. On the other hand, situation of the processor on the solder ball attach surface of the module substrate limits the area of the substrate that is available for attachment of solder balls. Also, this requires wafer thinning after solder bumping, which is not a standard process, and 0.2 mm chip thickness, as may be required, is difficult to achieve. Moreover, practical limits on wafer thinning may set a limit on employment of finer ball pitch (and smaller balls), which will be required for increasing input and output connectivity (I/O) without increasing the footprint of the processor chip. The memories and passive components can be assembled on the upper surface of the substrate using established surface mount techniques, and the memory packages can be tested prior to mounting (and packages that are below specification can be discarded). On the other hand, standard package footprints limit to four the number of memory packages that can be mounted on the upper surface of the module substrate. Also, the memory packages must be underfilled to provide satisfactory board level reliability of the solder ball connections, and the memory package underfill process can be slow and costly. The heat spreader can remove some heat from the module, but heat removal is not highly effective because no part of the heat spreader contacts the memory chips, and it is distant from the processor chip, which, in the case of a GPU, for example, may generate significant amounts of heat.

Figure 2:
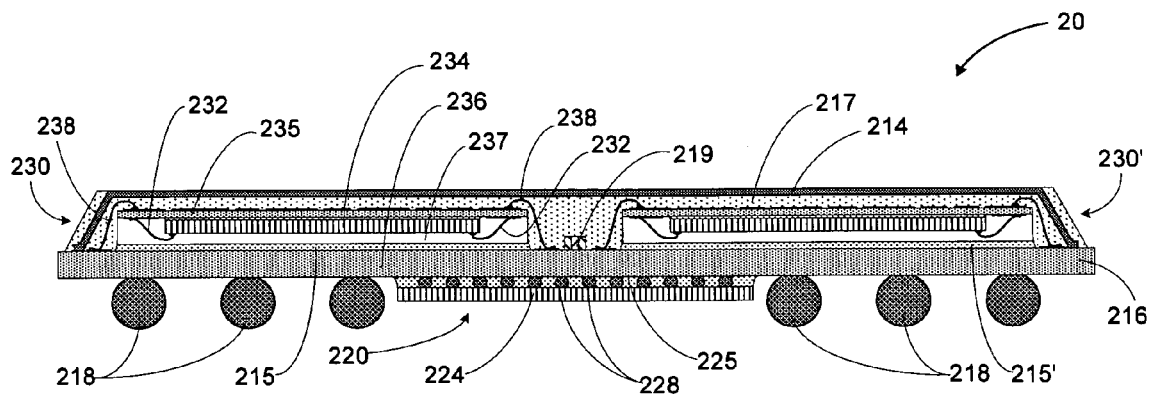
FIG. 2 is a diagrammatic sketch in a sectional view thru an embodiment of a multipackage module having a processor unit affixed to the lower side, and memory packages affixed to the upper side, of the multipackage module substrate according to an aspect of the invention.

FIG. 2 is a diagrammatic sketch in a sectional view thru an embodiment of a multipackage module generally at 20, having a processor unit affixed to the lower side generally as shown in FIG. 1 (the module has the processor flip chip mounted in a "die-up" configuration), and memory LGA packages affixed to the upper side, of the multipackage module substrate according to an aspect of the invention.

In the illustrative embodiment of FIG. 2, a module substrate 216, also 236, has a "lower" surface onto which solder balls 218 are attached, for connection by solder reflow to, for example, a motherboard (not shown). A processor 220 is mounted onto a processor mounting portion of the lower surface of the module 216. As shown in this example, the processor 220 has a flip-chip configuration; it includes a die 224 electrically connected by way of balls or bumps 228 to interconnect sites (not shown) in the lower surface of the module substrate, and affixed to the surface using an adhesive underfill material 225. A plurality of memory packages 230, 230' (there may typically be four memory packages; two are shown in the view of FIG. 2) are mounted on the upper surface of the module substrate 236. In the embodiment illustrated in FIG. 2 the memory packages are inverted saw-singulated land grid array (LGA) packages. Referring particularly to LGA package 230, each memory LGA package includes a die 234 affixed using an adhesive to a memory package substrate 235. The package substrate is a two-metal layer laminate, having patterned electrically conductive traces on the upper and lower surfaces of a dielectric layer; selected upper and lower traces are connected by way of vias (not shown) through the dielectric layer. The downward-facing active surface of the die is electrically connected to traces on the die attach (lower) surface of the package substrate 235 by wire bonds 232. The active surface of the die and the wire bonds are protected by an encapsulant 237.

Further referring to FIG. 2, the inverted memory LGA packages 230, 230' are affixed to the module substrate 236 using an adhesive material 215, 215' between the surface of the encapsulant 237 and the upper surface of the module substrate 236; and wire bonds 238 attached to wire bond pads on the upper surface of the package substrate 235 provide for electrical connection to wire bond pads in the upper surface of the module substrate 236. Additionally, passive devices, e.g., 219, are affixed to and electrically connected to traces in the upper surface of the module substrate 216. Also, in the illustrative example shown in FIG. 2, a heat spreader 214 is mounted onto the upper surface of the module substrate and covers memory LGA packages 230, 230'; and the memory LGA packages and the attachment arms of the heat spreader are encapsulated using an encapsulant material 217. A module such as is illustrated by way of example in FIG. 2, where the processor is a GPU, may typically have a module footprint about 31 mm×31 mm and an overall profile thickness about 2.8 mm or greater, with a 10.5 mm×10.5 mm GPU and 12 mm×12 mm memory BGA packages.

As in the example of FIG. 1, embodiments having a configuration as in FIG. 2 have the processor mounted on the second-level interconnect solder ball (lower) surface of the module substrate. Accordingly, it can provide a thin module, and provides for point-to-point connection of the processor chip and the solder balls, avoiding electrical parasitics and providing high electrical performance in the processor. However, as in the example of FIG. 1, the area of the substrate that is available for attachment of solder balls is limited, and wafer thinning is required. Also as in the configuration of FIG. 1, embodiments as in FIG. 2 can be constructed using established techniques and processing infrastructure, but are limited to having four memory packages per module. Although memory packaging in LGA form is not standard, it can be readily procured, and has a lower cost basis than standard chip scale (CSP) packages. A molded-in heat spreader in embodiments as in FIG. 2 has lower cost and can be more effective in heat dissipation than heat spreaders as in FIG. 1. Because the memory packages are of the LGA type, requiring no solder balls to connect to the module substrate, and accordingly requiring no underfill, the invention as embodied for example in FIG. 2 can provide for a thinner overall module profile and better board level reliability and less time-consuming and costly mount process. As noted above, the invention as embodied in FIG. 2 provides for a module having the same footprint as in FIG. 1, but can provide a thinner overall module profile.

Figure 3:
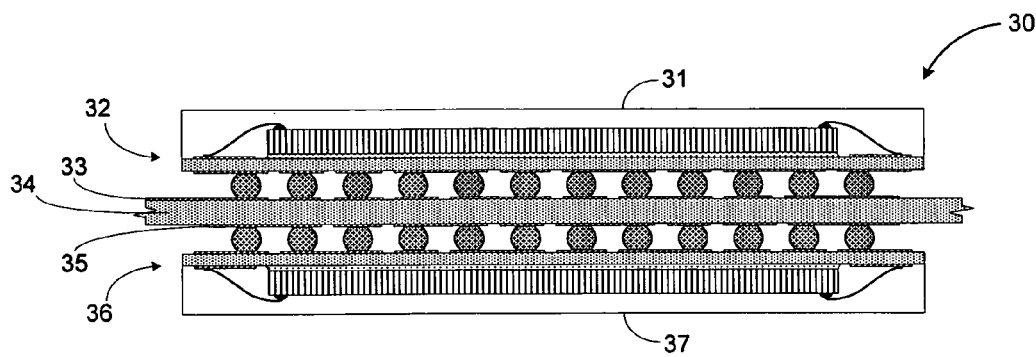
FIG. 3 is a diagrammatic sketch in a sectional view thru a memory package stack in an arrangement suitable for use in various embodiments of the invention as shown for example in FIGS. 4C, 5C and 6C.
Figure 4A:
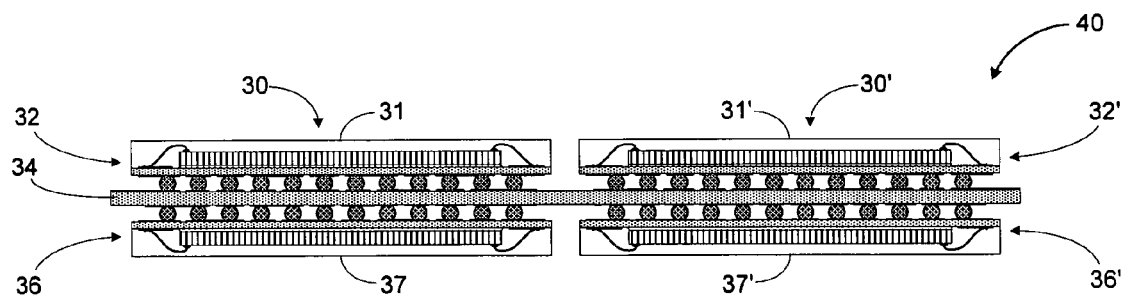
FIG. 4A is a diagrammatic sketch in a sectional view thru a stacked memory package assembly according to one aspect of the invention, suitable for use together with a multipackage module substrate as shown for example in FIG. 4B in an embodiment of the invention as shown in FIG. 4C.
Figure 4B:
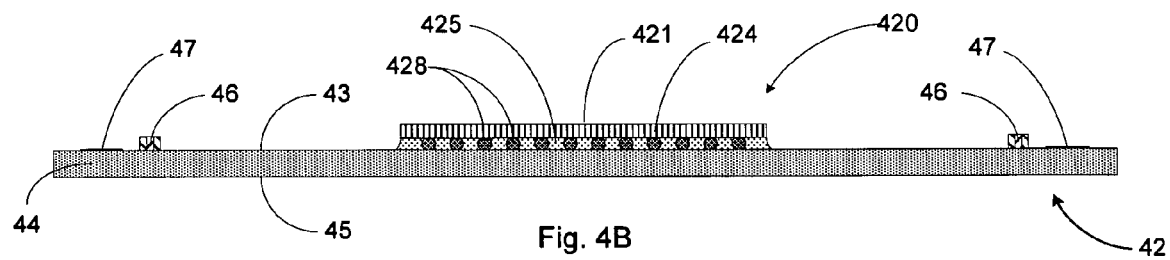
FIG. 4B is a diagrammatic sketch in a sectional view thru a multipackage module substrate including a medially-mounted processor unit suitable for use in a multipackage module according to one aspect of the invention.
Figure 4C:
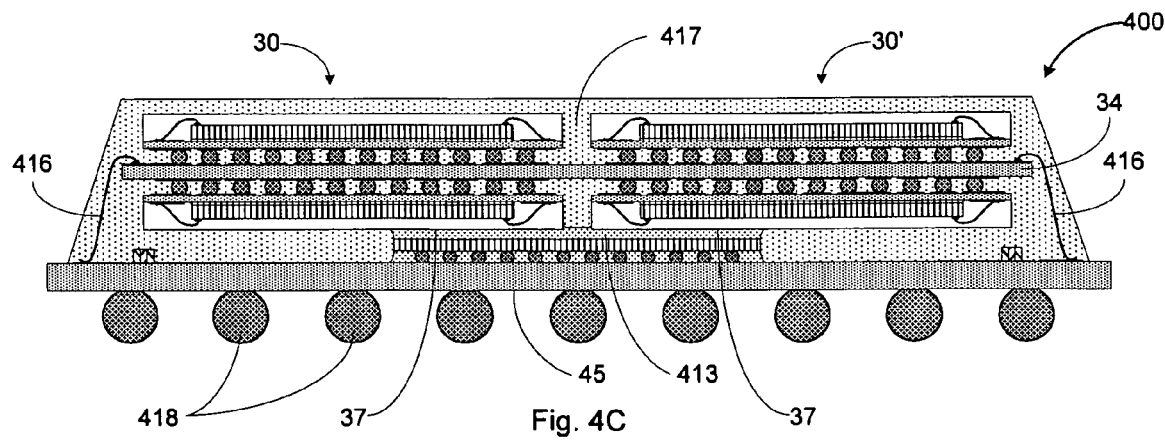
FIG. 4C is a diagrammatic sketch in a sectional view thru a multipackage module according to one aspect of the invention.
Figure 5A:
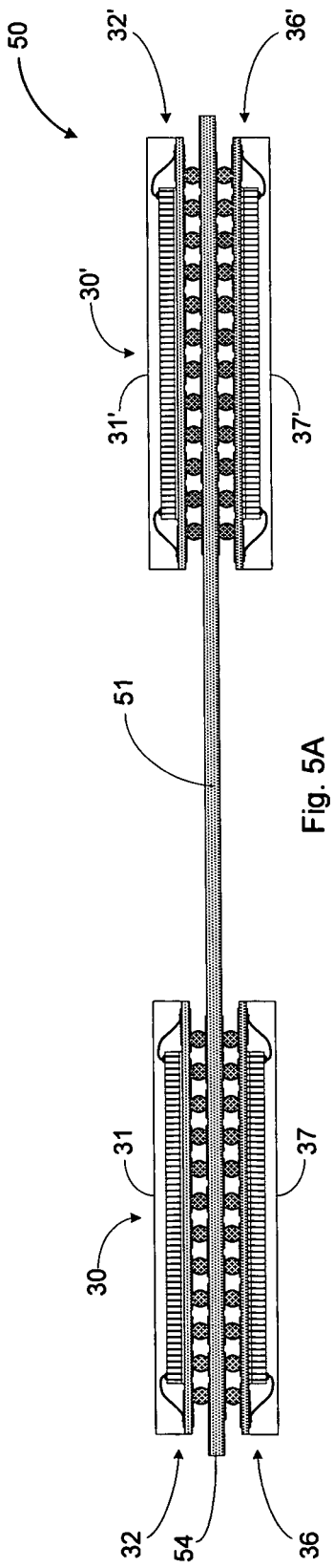
FIG. 5A is a diagrammatic sketch in a sectional view thru a stacked memory package assembly according to another aspect of the invention, suitable for use together with a multipackage module substrate as shown for example in FIG. 5B in an embodiment of the invention as shown in FIG. 5C.
Figure 5B:
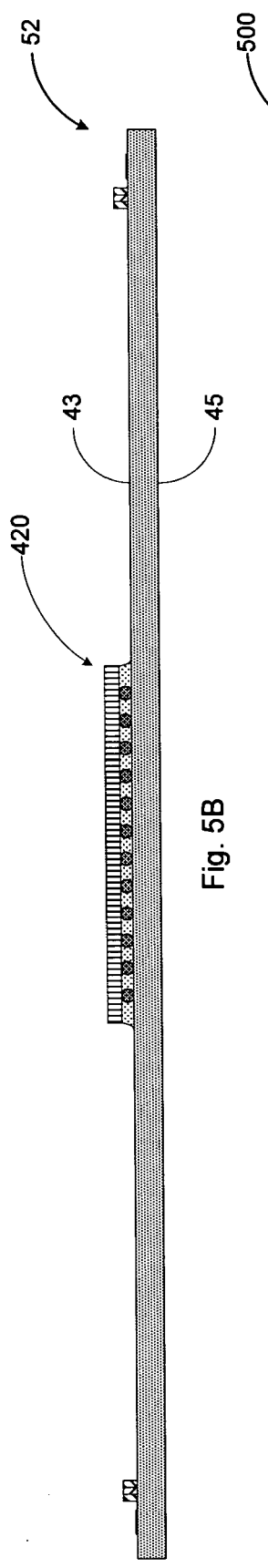
FIG. 5B is a diagrammatic sketch in a sectional view thru a multipackage module substrate including a medially-mounted processor unit suitable for use in a multipackage module according to an aspect of the invention.
Figure 5C:
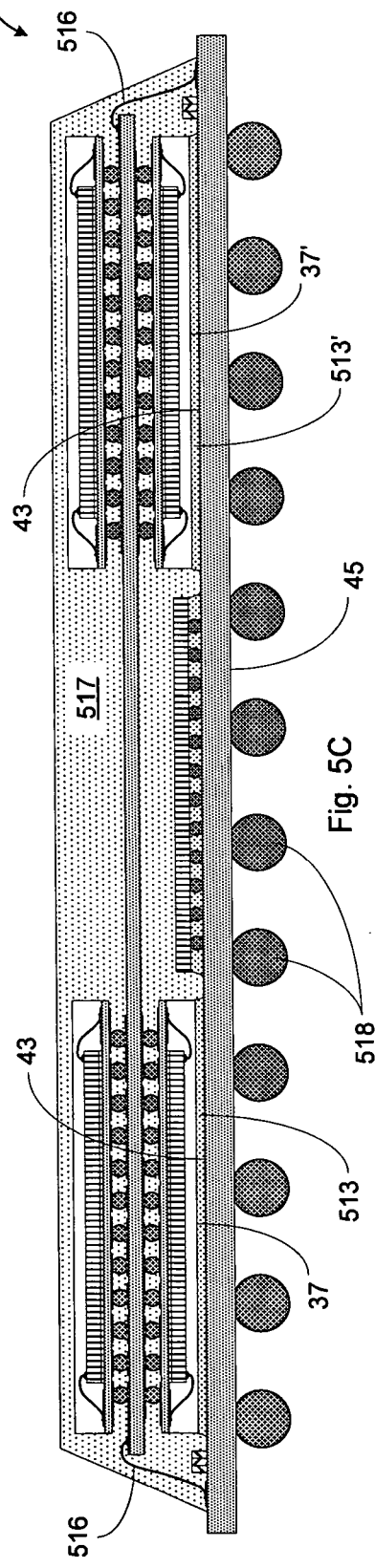
FIG. 5C is a diagrammatic sketch in a sectional view thru a multipackage module according to an aspect of the invention.

FIG. 3 is a diagrammatic sketch in a sectional view thru a memory package stack generally at 30 in an arrangement suitable for use in various embodiments of the invention as shown for example in FIGS. 4C, 5C and 6C. Referring to FIG. 3, the memory package stack 30 includes two BGA type packages 32, 36, mounted onto a common package stack substrate 34. The die in each BGA package is affixed to a die attach surface of its package substrate using an adhesive. Electrical connection of the die in each BGA package is made by way of wire bonds between wire bond pads (not shown) on the active surface of the die and wire bonding sites on the die attach surface of the BGA package substrate, and the wire bonds and the active surface are protected by an encapsulation material. An array of solder balls is attached to solder ball pads on the opposite surface of the BGA package substrate; and connection of each memory BGA package to the common memory stack substrate is made by solder reflow of the solder balls to solder reflow sites, e.g., 33 (for package 32), and, e.g., 35 (for package 36). One of the packages in the stack is "inverted", namely package 36 in stack 30; that is, the ball array attachment surface of the package substrate faces upward. The surfaces 31, 37 of the respective encapsulations constitute "upper" (31) and "lower" (37) surfaces of the memory BGA package stack 30.

FIG. 4A is a diagrammatic sketch in a sectional view thru a stacked memory package assembly 40 according to one aspect of the invention, suitable for use together with a multipackage module substrate as shown for example in FIG. 4B in an embodiment of the invention as shown in FIG. 4C. Here a plurality of memory package stacks 30, 30' (there may for example be four or more such stacks in a package assembly according to the invention) are connected by a common stack assembly substrate 34, which serves as the package stack substrate for all the stacks in the assembly. The FIGS. show two stacks of two packages each, i.e., 32, 36 in stack 30, and 32', 36' in stack 30'. An additional two stacks, hidden from this view behind those shown in the FIGS., may also be connected to the common stack assembly substrate, providing eight memory BGA packages in the memory package assembly 40. The stacks 30 and 30' are constructed generally as described with reference to FIG. 3. The surfaces 31 and 31', 37 and 37' of the respective encapsulations constitute upper (31, 31') and lower (37, 37') surfaces of the stacked memory package assembly 40.

FIG. 4B is a diagrammatic sketch in a sectional view thru a multipackage module substrate, generally at 42, including a medially-mounted processor unit suitable for use in a multipackage module according to one aspect of the invention. Referring to FIG. 4B, a module substrate 44 is provided, having "lower" 45 and "upper" 43 surfaces having bonding pads and electrical traces (not shown, except as noted below) as is generally understood in the art. A processor (here in a flip chip "die-up" configuration) 420 is mounted onto a processor mounting portion of the upper surface 43 of the module substrate 44. The processor includes a die 424 electrically connected by way of balls or bumps 428 to interconnect sites (not shown) on the processor mounting portion of the upper module substrate surface 43, and affixed to the substrate using an adhesive underfill material 425. Passive devices, e.g., 46, may additionally be mounted onto the upper module substrate surface 43.

FIG. 4C is a diagrammatic sketch in a sectional view thru a multipackage module, generally at 400, according to one aspect of the invention. As shown in FIG. 4C, a stacked memory package assembly as in FIG. 4A is mounted over a module substrate having a processor and passive devices mounted on it. The memory package assembly is aligned over and affixed to the processor using an adhesive 413 between the upper surface of the processor (421 in FIG. 4B) and medial portions of the lower surface 37, 37' of the stacked memory package assembly 40. The z-interconnect between the memory packages and the module substrate is made by way of wire bonds 416 connecting wire bond pads on the upper surface of the memory package assembly substrate 34 and wire bonding sites (47 in FIG. 4B) on the upper surface of the module substrate. The assembly is mechanically stabilized by, and the z-interconnect wire bonds 416 are protected by, an encapsulant material 417. Solder balls 418 are attached in an array to solder ball sites in the lower surface 45 of the module substrate. Connection of the completed module 400 to apparatus for use, as for example a motherboard (not shown), is made by solder reflow of the solder balls 418.

A module such as is illustrated by way of example in FIG. 4C, where the processor is a GPU, may typically have a footprint about 31 mm×31 mm and an overall profile thickness as much as about 5.2 mm, with a 10.5 mm×10.5 mm GPU and standard 12 mm×12 mm CSP memory packages.

The invention as exemplified in FIGS. 4A, 4B and 4C provides a number of advantages. Particularly, for example, placement of the processor (such as a graphics processor, or a CPU, or an ASIC) on the upper surface of the module substrate both provides a greater surface area for the solder ball array and removes any thickness impediment to smaller solder ball size and, accordingly, solder ball pitch in the connection to the motherboard. Significantly greater numbers on I/O connections can be made with smaller solder ball pitch. And, for example, the memory BGA packages may be standard memory chip scale packages (CSPs), and can be assembled on the opposing surfaces of the memory package assembly substrate using standard surface mount techniques; and then the memories can all be tested to meet specification before committing them to assembly on the module substrate. Also, the processor can be tested on the module substrate prior to installation of the tested memory package assembly onto the module substrate. The z-interconnect by way of wire bonds between the common memory package assembly substrate and the module substrate is fast and effective and low in cost. No underfilling of the memory packages on the common memory package assembly substrate is required, because mechanical reinforcement is provided by the encapsulation following assembly. The stacked memory assembly package can have eight memory packages (in four stacks of two packages each); or more (for example, 12 packages in 6 stacks of two packages each) in larger footprint modules. This provides for high speed and high memory capacity adjacent the processor, which may particularly useful, for example, for high speed or high capacity graphical applications. For a given number and arrangement of memory packages, any of a variety of processors, having various die dimensions, may be used, without changing the overall footprint size of the completed module. Having the processor in a flip-chip die-down configuration can provide for a standardized ball-out footprint. A module as in FIG. 4C, having 8 memory packages in 4 stacks of two each, can have a footprint about the same as in the example of FIG. 1; but the module will be thicker, and its cooling capacity can be significantly reduced by comparison.

FIG. 5A is a diagrammatic sketch in a sectional view thru a stacked memory package assembly, generally at 50, according to another aspect of the invention, suitable for use together with a multipackage module substrate as shown for example in FIG. 5B in an embodiment of the invention as shown in FIG. 5C. As will appear from comparison of FIGS. 5A and 4A, the stacked memory package assembly 50 is substantially similar to stacked memory package assembly 40, except that in assembly 50 the common stack assembly substrate 54 has an extensive middle portion 51, providing an interval between the respective stacks 30 and 30'. According to this aspect of the invention, the interval provided by middle section 51 is sufficiently wide to accommodate the footprint of the processor 420 on a multipackage module substrate 52, as shown for example in FIG. 5B. That is, when the stacked memory package assembly 50 is aligned over the processor 420 and is then brought into contact with the upper surface 43 of the multipackage module substrate 52, the memory stacks 30, 30' are situated over portions of the module substrate surface 43 entirely to one side or the other of the processor mounting portion of the module substrate surface, that is, outside the footprint of the die 420. As shown in FIG. 5C, the lower surfaces 37, 37' of the stacked memory package assembly 50 can be affixed to these more laterally positioned portions (indicated 43, 43 in FIG. 6C) of the module substrate surface using adhesive material 513, 513', entirely without overlap with the processor mounting portion of the module substrate surface, and entirely without mechanical interference with a processor 420 mounted on it. As in the multipackage module of FIG. 4C, the z-interconnect between the memory packages and the module substrate is made by way of wire bonds 516 connecting wire bond pads on the upper surface of the memory package assembly substrate 54 and wire bonding sites on the upper surface 43 of the module substrate. The assembly is mechanically stabilized by, and the z-interconnect wire bonds 516 are protected by, an encapsulant material 517. Solder balls 518 are attached in an array to solder ball sites in the lower surface 45 of the module substrate. Connection of the completed module 500 to apparatus for use, as for example a motherboard (not shown), is made by solder reflow of the solder balls 518.

A module such as is illustrated by way of example in FIG. 5C, where the processor is a GPU, may typically have a footprint about 37.5 mm×37.5 mm and an overall profile thickness about 4.9 mm, with a 10.5 mm×10.5 mm GPU and standard 12 mm×12 mm CSP memory packages. The increase in footprint dimension amounts to an overall module area increase about 36% as compared with the module as in FIG. 4C.

A module as in FIG. 5C can have advantages as described above with reference to FIG. 4 and, in addition, has the advantage of thinner overall profile. More importantly, the configuration of FIG. 5C can be readily adapted for highly effective cooling, as appears in FIG. 6C. FIG. 6A is a diagrammatic sketch in a sectional view thru a stacked memory package assembly 60 according to another aspect of the invention, suitable for use together with a multipackage module substrate as shown for example in FIG. 6B in an embodiment of the invention as shown in FIG. 6C. As will appear from comparison of FIGS. 6A and 5A, the stacked memory package assembly 60 is substantially similar to stacked memory package assembly 50, except that in assembly 60 the middle portion of the common stack assembly substrate 64 is partially cut out to provide an opening 61 that is situated over the processor 420 when the assembly 60 is aligned over the module substrate 52. A heat spreader 624 is aligned over the stacks 30, 30', and is affixed using an adhesive 615, 615' between the lower surface 623, 623' of the heat spreader and the upper surface 31, 31' of the memory stacks 30, 30'. A heat slug 626 is attached to a middle portion of the lower surface of the heat spreader 624, or is an integral part of it. The heat slug 626 is accommodated by the opening 61 in the middle portion of the common stack assembly substrate 64, and is dimensioned so that, when the lower surfaces 37, 37' of the stacked memory package assembly 60 are affixed using adhesive 513, 513' to the upper surface 43 of the module substrate, a lower surface 627 of the heat slug is positioned near to the upper surface (421 in FIG. 6B) of the processor 420, and can be affixed to it using an adhesive 613 (which may be a thermally conductive adhesive). Preferably the bottom surface of the heat spreader 624 and the bottom and side surfaces of the heat slug 626 are treated to form a black oxide, providing better contact and adhesion with the underlying adhesive materials and encapsulant. And the top surface of the heat spreader can be treated to have a matte nickel finish, to facilitate marking. As in the multipackage module of FIG. 5C, the z-interconnect between the memory packages and the module substrate is made by way of wire bonds 516 connecting wire bond pads on the upper surface of the memory package assembly substrate 64 and wire bonding sites on the upper surface 43 of the module substrate. The assembly is mechanically stabilized by, and the z-interconnect wire bonds 516 are protected by, an encapsulant material 617. Notches 625 at the edges of the heat spreader may be provided to interlock the heat spreader and the encapsulant and prevent delamination. Solder balls 518 are attached in an array to solder ball sites in the lower surface 45 of the module substrate. Connection of the completed module 600 to apparatus for use, as for example a motherboard (not shown), is made by solder reflow of the solder balls 518.

A module as shown in FIG. 6C can have advantages as described above with reference to FIG. 5C, although the thickness of the heat spreader adds a small amount to the overall profile thickness. The heat spreader in the configuration of FIG. 6C can provide very effective heat dissipation directly from the processor.

FIG. 7 is a diagrammatic sketch in a sectional view thru a memory package stack, generally at 70, in an arrangement suitable for use in various embodiments of the invention as shown for example in FIGS. 8 and 9. Referring to FIG. 7, the memory package stack 70 includes two LGA type packages 72, 76, stacked in the same orientation (both inverted in this illustration) one over the other and separated by spacer 723. The two stacked LGA packages are mounted onto a common package stack substrate 74, using an adhesive between the upper surface of the common package stack substrate 74 and the downward-facing surface of the package encapsulation of the lower LGA package 72. The die in each LGA package is affixed to a die attach surface of its package substrate using an adhesive. Electrical connection of the die in each LGA package is made by way of wire bonds between wire bond pads (not shown) on the active surface of the die and wire bonding sites on the die attach surface of the LGA package substrate, and the wire bonds and the active surface are protected by an encapsulation material. Connection of each memory LGA package to the common memory stack substrate is made by wire bonding (wire bonds 726 for package 76; wire bonds 722 for package 72) between wire bond pads on the upper surfaces of the respective LGA package substrates and wire bond sites (e.g., 73) on the common package stack substrate 74. The spacer 723 is arranged between the "upward facing" surface 761 of the lower LGA package 72 substrate and the "downward facing" surface 727 of the encapsulation of the upper LGA package 76. The space is of sufficient thickness to provide relief between the two packages to accommodate the loops of the wire bonds 722.

Stacked LGA memory packages 70 as illustrated in FIG. 7 can be made thinner than stacked BGA memory package assemblies 30 as illustrated in FIG. 3, for example, because even though the stacked LGA packages require the use of a spacer there is no ball thickness component. Also, because the wire bond pads on the LGA substrates are situated near the edges of the packages, and there is no routing circuitry from beneath the respective die, as is required in the BGA packages, stacked LGA packages can provide greater speed.

As shown in FIG. 8, a multipackage module, generally at 800, according to another aspect of the invention can be made by affixing spaced stacked LGA packages 76, 72, as described generally with reference to FIG. 7, onto memory attach portions of a module substrate 82 constructed and mounted with a processor generally as shown in FIG. 5B. In the configuration of FIG. 8, the module substrate is effectively the common memory stack substrate 74 of FIG. 7, and the z-interconnection between the memory packages in each stack 70 is made by way of wire bonds from the respective LGA package substrates to the upper surface of the module substrate. As in other embodiments, solder balls 818 are attached in an array to solder ball sites in the lower surface of the module substrate, and connection to apparatus for use, as for example to a motherboard (not shown), is made by solder reflow of the solder balls 818.

The configuration as in FIG. 8 is readily adapted for enhanced heat dissipation, as is shown for example in FIG. 9. Referring now to FIG. 9, a multipackage module, generally at 900, is constructed generally as in FIG. 8 but is additionally provided with a heat spreader 624 (with optional notches 625 at the edges) and heat slug 626, generally constructed as in FIG. 6A. In the embodiment of FIG. 9, the heat spreader is affixed to the upper surface of the processor using an adhesive 913. The assembly is mechanically stabilized by encapsulant material 917, and connection to, for example, a motherboard (not shown) is made by solder reflow of solder balls 918 attached to solder ball pads (not shown) on the lower surface of the module substrate.

The multipackage module of FIG. 9 provides a footprint generally about the same as that of FIG. 6C, for example, or FIG. 8; but the FIG. 9 module can have a thinner overall profile than that of FIG. 6C, as little as about 1.725 mm above the module substrate, or about 2.925 mm overall.

Figure 10:
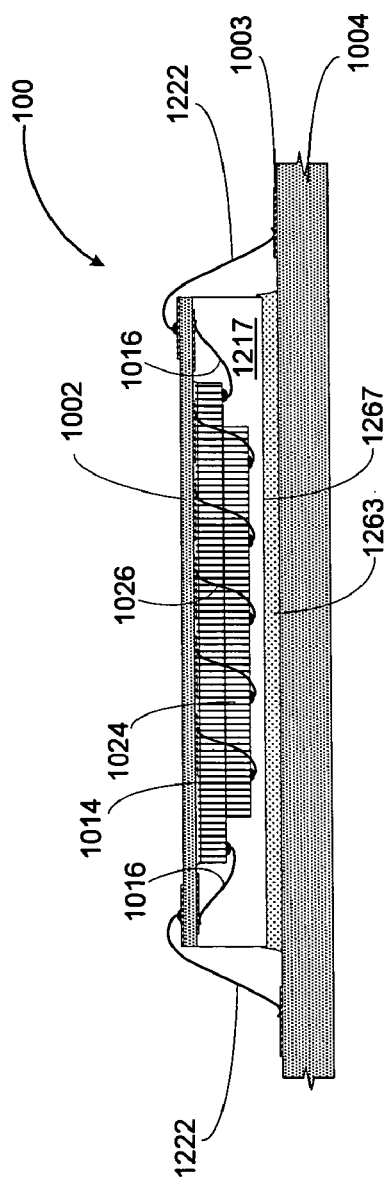
FIG. 10 is a stacked die memory package, suitable for use according to one aspect of the invention together with a multipackage module substrate as shown for example in FIG. 6B in an embodiment of the invention as shown in FIG. 11.
Figure 11:
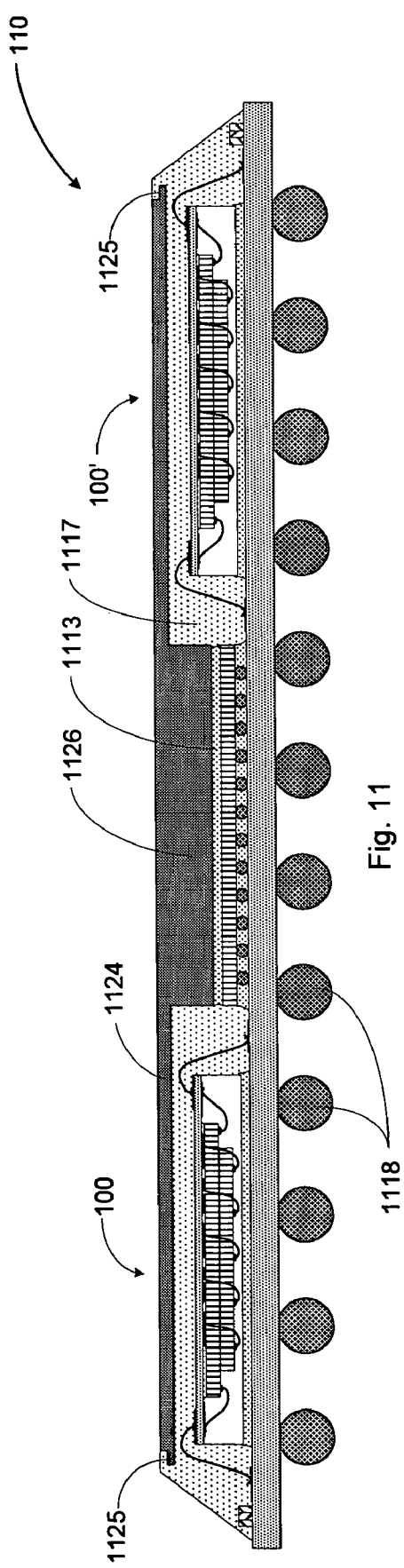
FIG. 11 is a diagrammatic sketch in a sectional view thru a multipackage module according to a further aspect of the invention.

FIG. 10 shows generally at 100 a stacked die memory package, suitable for use according to one aspect of the invention together with a multipackage module substrate as shown for example in FIG. 6B in an embodiment of the invention as shown in FIG. 11. According to this aspect of the invention, a stacked die memory package 100 includes stacked first and second die 1014, 1024. The package is in an inverted configuration, that is, the die are attached to the "downward-facing" surface of the package substrate. First die 1014 is affixed to the downward surface of a package substrate 1002 using an adhesive on the non-active surface of the die. The first die 1014 is electrically connected to the package substrate by wire bonds 1016 between wire bond sites (not shown) in the active surface of the die and wire bond pads on the die attach surface of the substrate. The second die 1024 is electrically connected to the package substrate by wire bonds 1026 between wire bond sites (not shown) in the active surface of the die and wire bond pads on the die attach surface of the substrate. In some configurations each of the memory die 1014, 1024 has a rectangular footprint, with bond pads arranged along two opposite sides, and the die can be arranged as a "crossed-die" stack. Or, as will be appreciated, where a smaller die is stacked over a larger die, die-to-die wire bond interconnects between the stacked die can be made, as is typical of some ASIC arrangements. The wire bonds 1016, 1026 and the active surfaces of the die are protected by encapsulation material 1217, which defines a "downward-facing" side of the stacked die package 100. The stacked die package is affixed to a common substrate 1004 using an adhesive 1263 between the upper surface of the common substrate and the downward-facing surface 1267 of the package. Z-interconnection of the memory package to the common substrate is made by wire bonds 1222 connected between wire bond pads in the "upward-facing" surface of the package and wire bond pads, e.g., 1003, on the "upper" surface of the common substrate 1004.

As FIG. 11 shows, a multipackage module, generally at 110, according to another aspect of the invention can be made by affixing stacked die packages 100, 100', as described generally with reference to FIG. 10, onto memory attach portions of a module substrate constructed and mounted with a processor generally as shown in FIG. 5B. In the configuration of FIG. 11, the module substrate is effectively the common memory stack substrate 1004 of FIG. 10, and the z-interconnection for the memory packages 100 is made by way of wire bonds from the respective stacked die package substrates to the upper surface of the module substrate.

The configuration as in FIG. 11 has been adapted for enhanced heat dissipation, in a manner generally as described and shown in FIG. 9. That is, the module is provided with a heat spreader 1124 (with optional notches 1125 at the edges) and heat slug 1126, generally constructed as in FIG. 6A. In the embodiment of FIG. 11, the heat spreader is affixed to the upper surface of the processor using an adhesive 1113. Preferably the bottom surface of the heat spreader and the bottom and side surfaces of the heat slug are treated to form a black oxide, providing better contact and adhesion with the underlying adhesive materials and encapsulant; and the top surface of the heat spreader can be treated to have a matte nickel finish, to facilitate marking. The assembly is mechanically stabilized by encapsulant material 1117, and connection of the completed module 110 to, for example, a motherboard (not shown) is made by solder reflow of solder balls 1118 attached to solder ball pads (not shown) on the lower surface of the module substrate.

The multipackage module of FIG. 11 provides a footprint generally about the same as that of FIG. 6C, for example, or FIG. 8 or 9; but the FIG. 11 module can have a still thinner overall profile than that of FIG. 9, as little as about 1.17 mm above the module substrate, or about 2.5 mm overall. This configuration provides eight memory die (stacked two each in each of four different packages), or—as will be appreciated—more, if there are a greater number of die in each stacked die package, or if there are a greater number of packages arranged on the module substrate.

The multipackage module of FIG. 11 can be made very thin as compared with the modules of FIG. 9 or 6C, for example, and can provide advantages of very fast performance and better cooling. However, using stacked die memory packages, as in FIG. 11, as compared with using stacked memory assemblies, as in FIG. 9, for example, can give a lower overall yield in manufacture. Particularly, the memory packages in the stacked memory package assemblies (such as assembly 70) can be tested before assembly, and those having unacceptable performance can be discarded prior to use; although the stacked memory packages (such as package 100) can be tested, the individual die in stacked die memory packages are less readily tested until after they have been stacked, and at that point a failed die results in a failed stack.

Processes for making various of the components (such as, for example, substrates, die, various BGA and LGA packages, and the like) for use in assembly according to the invention of the various configurations of the invention are known in the art and many are well established in the industry.

Testing of BGA memory packages and of BGA processor units is well established in the industry, and typically is done by accessing contact to the solder ball pads. LGA packages can be tested in either of two ways, namely by accessing the LGA pads on the lower surface of the LGA of the substrate, similar to the pads of the solder balls in a BGA; or by accessing the z-interconnect pads on the upper surface of the substrate. The completed module can be tested in the same as for testing BGAs.

The MPM assembly process is apparent from the various views of the drawings. Particularly, for example, the views in FIGS. 3, 4A and 4B are illustrative examples of parts to be assembled to make an embodiment as in FIG. 4C; the views in FIGS. 5A and 5B are illustrative examples of parts to be assembled to make an embodiment as in FIG. 5C; the views in FIGS. 6A and 6B are illustrative examples of parts to be assembled to make an embodiment as in FIG. 6C; the views in FIGS. 7 and 5B or 6B are illustrative examples of parts to be assembled to make an embodiment as in FIG. 8 or FIG. 9; and the view in FIG. 10, together with views in other FIGS. are illustrative examples of parts to be assembled to make an embodiment as in FIG. 11. As will be appreciated, however, various of the steps of assembly of the various embodiments need not be carried out in the order shown. Also, as will be appreciated, certain of the components shown are as a matter of course the results of multistep operations.

Other combinations are contemplated within the scope of the invention and will be readily apparent from the description and drawings.

I claim:

1. A method for making a multi-package module, comprising:
    providing a module substrate having first and second surfaces, providing a processor, and providing a plurality of memory packages wherein providing the plurality of memory packages comprises providing memory packages as a memory package stack comprising a memory package affixed to and electrically connected to a memory stack substrate;
    mounting the processor die on a processor attach portion of the first surface of the module substrate;
    mounting the memory packages at least over a portion of the first surface of the module substrate that is at least partly adjacent the processor attach portion; and
    forming wire bond z-interconnection of at least one of the memory packages to the module substrate wherein forming wire bond z-interconnection comprises forming wire bonds between the memory stack substrate and the module substrate.

2. The method of claim 1 wherein providing the memory packages as a memory package stack comprises providing a plurality of memory packages affixed to and electrically connected to a memory stack substrate.

3. The method of claim 2 wherein providing the memory packages as a memory package stack comprises providing a memory stack substrate having first and second surfaces and providing at least one memory package affixed to and electrically connected to each surface of the memory stack substrate.

4. The method of claim 2 wherein providing the memory packages as a memory package assembly comprises providing a memory package substrate having and providing a plurality of memory packages affixed to and electrically connected to a surface of the memory assembly substrate.

5. The method of claim 1 wherein at least one of the memory packages is a ball grid array package.

6. The method of claim 1 wherein at least one of the memory packages is a land grid array package.

7. A method for making a multi-package module, comprising:
   providing a module substrate having first and second surfaces, providing a processor, and providing a plurality of memory packages wherein providing the plurality of memory packages comprises providing LGA memory packages as a memory package stack comprising a second memory package stacked onto a first memory package, and wherein forming wire bond z-interconnection comprises forming wire bonds between the memory packages and the module substrate;
   mounting the processor die on a processor attach portion of the first surface of the module substrate;
   mounting the memory packages at least over a portion of the first surface of the module substrate that is at least partly adjacent the processor attach portion; and
   forming wire bond z-interconnection of at least one of the memory packages to the module substrate.

8. A method for making a multi-package module, comprising:
   providing a module substrate having first and second surfaces, providing a processor, and providing a plurality of memory packages affixed to and electrically connected to a memory stack substrate wherein mounting the memory packages over a portion of the first surface of the module substrate that is at least partly adjacent the processor attach portion comprises mounting the memory packages over a portion of the processor die;
   mounting the processor die on a processor attach portion of the first surface of the module substrate;
   mounting the memory packages at least over a portion of the first surface of the module substrate that is at least partly adjacent the processor attach portion; and
   forming wire bond z-interconnection between the memory stack substrate and the module substrate of at least one of the memory packages to the module substrate.

9. The method of claim 8 wherein mounting the memory packages over a portion of processor comprises affixing at least a portion of at least one of the memory packages onto the processor die.

10. A method for making a multi-package module, comprising:
    providing a module substrate having first and second surfaces, providing a processor, and providing a plurality of LGA memory packages wherein providing the plurality of memory packages comprises mounting a first memory package onto the surface of the module substrate and mounting a second memory package onto the first memory package;
    mounting the processor die on a processor attach portion of the first surface of the module substrate;
    mounting the memory packages at least over a portion of the first surface of the module substrate that is at least partly adjacent the processor attach portion; and
    forming wire bond z-interconnection of at least one of the memory packages to the module substrate.

11. The method of claim 10 wherein the first memory package is a ball grid array package, and the second package is a land grid array package, and wherein forming wire bond z-interconnection comprises forming wire bonds between the second package and the module substrate.

12. The method of claim 10 wherein each of the first memory package and the second memory package is a land grid array package, and wherein forming wire bond z-interconnection comprises forming wire bonds between each package and the module substrate.

13. The method of claim 12 wherein mounting the second memory package onto the first memory package comprises affixing a spacer onto the active surface of the first package and affixing the second package onto the spacer.

* * * * *